United States Patent
Wu et al.

(10) Patent No.: US 6,825,094 B2
(45) Date of Patent: Nov. 30, 2004

(54) METHOD FOR INCREASING CAPACITANCE OF DEEP TRENCH CAPACITORS

(75) Inventors: Chang-Rong Wu, Taipei (TW); Yi-Nan Chen, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/628,895

(22) Filed: Jul. 28, 2003

(65) Prior Publication Data

US 2004/0198014 A1 Oct. 7, 2004

(30) Foreign Application Priority Data

Apr. 2, 2003 (TW) ........................................ 92107472 A

(51) Int. Cl.[7] ...................... H01L 21/8242; H01L 21/20
(52) U.S. Cl. ........................ 438/386; 438/243; 438/245; 438/388
(58) Field of Search ................................. 438/243–249, 438/386–392

(56) References Cited

U.S. PATENT DOCUMENTS

| | | | | |
|---|---|---|---|---|
| 6,117,726 A | * | 9/2000 | Tsai et al. | 438/242 |
| 6,144,054 A | * | 11/2000 | Agahi et al. | 257/296 |
| 6,204,527 B1 | * | 3/2001 | Sudo et al. | 257/301 |
| 6,605,504 B1 | * | 8/2003 | JaiPrakash et al. | 438/243 |

* cited by examiner

*Primary Examiner*—Thanh Nguyen
(74) *Attorney, Agent, or Firm*—Quintero Law Office

(57) ABSTRACT

A method for increasing the capacitance of deep trench capacitors. The method includes providing a substrate, forming a pad structure on the substrate, forming a photoresist defining the region of the deep trench on the pad structure, forming a deep trench in the substrate, removing the photoresist, forming a capacitor in the lower portion of the deep trench, forming a first insulation layer on the capacitor, forming an epitaxy layer on the sidewall of the deep trench above the first insulation layer as a liner to narrow the dimension of the deep trench, and removing the first insulation layer uncovered by the epitaxy layer.

17 Claims, 5 Drawing Sheets

METHOD FOR INCREASING CAPACITANCE OF DEEP TRENCH CAPACITORS

BACKGROUND OF THE INVENTION

1. Field of the Invention

The present invention relates to a method for forming deep trench capacitors, and more specifically to a method for increasing capacitance of deep trench capacitors.

2. Description of the Related Art

Generally speaking, capacitors widely used in dynamic random access memory (DRAM) are formed by two conductive layers (electrode plate) having an insulation layer between. The ability to store electric charges of a capacitor depends on the thickness of the insulation layer, surface area of the electrode plate and the electrical characteristics of the insulation material. In recent developments for reducing sizes of semiconductor elements to enhance integration density, the area of memory cells in a memory must continuously be reduced to support a larger number of memory cells, thereby increasing density. Meanwhile, the electrode plates of a capacitor in a memory cell must contain sufficient surface area to store sufficient electrical charges.

Nevertheless, with sizes of elements continuously reduced, the trench storage node capacitance of DRAM is decreased as well. As a result, the storage capacitance must be increased to maintain good operating performance.

Consequently, it is necessary to develop a method for increasing the storage capacitance, for example, etching the semiconductor substrate to enlarge surface area of the bottom of the trench, and then forming a bottle-shaped trench capacitor. Currently, the above method is widely used for increasing the storage capacitance of DRAM.

FIGS. 1A to 1C are cross-sections illustrating the conventional process flow for forming a bottle trench. First, referring to FIG. 1A, a patterned pad layer 12 is formed on a silicon substrate 10. Then, the patterned pad layer 12 is used as an etching mask to etch the silicon substrate 10 by dry etching to form a trench 14 containing an upper portion 16 and a lower portion 18. The dimension 13' of the trench 14 is formed.

Next, referring to FIG. 1B, a photoresist layer (not shown) covering the lower portion 18 of the trench 14 is deposited. A sacrificial layer 20 covering the upper portion 16 of the trench 14 and the pad layer 12 is deposited. Then, the photoresist layer (not shown) is removed and the sacrificial layer 20 on the pad layer 12 is removed by anisotropic etching later. Finally, the sacrificial layer 20 is formed in the upper portion 16 of the trench 14.

Subsequently, referring to FIG. 1C, the silicon substrate 10 uncovered by the sacrificial layer 20 of the lower portion 18 of the trench 14 is etched by isotropic wet etching using ammonia and diluted hydrogen fluoride to form the lower portion 22 of the bottle-shaped trench 14. The dimension 13 of the lower portion 22 is larger than the dimension 13' of the upper portion 16 of the trench 14.

It is difficult to control the shape of the lower portion 22 of the trench 14 by the above method, and it results in increased instability and difficulty of the fabricating process.

SUMMARY OF THE INVENTION

In order to solve the conventional problems, an object of the invention is to provide a method for increasing the storage capacitance of a deep trench capacitor of a DRAM by enlarging surface area of the lower portion of the trench.

The invention forms a larger dimension of the trench at first to enlarge surface area of electrode plates of the capacitor, then narrows the dimension of the trench by forming an epitaxy layer on the sidewalls in the upper portion of the trench. Finally, the predetermined dimension is formed. The structure of the epitaxy layer is the same as the substrate, so that the electrical characteristics of the memory are maintained. The invention is formed as a bottle-shaped trench as well, thereby improving control of the shape of the bottom of the trench, further, increasing stability of the fabricating process.

The method for increasing the capacitance of the trench capacitors provided in the invention includes the following steps. First, a substrate is provided, and a pad structure is formed on the substrate. Next, a photoresist defining the deep trench is formed on the pad structure, and a deep trench is formed in the substrate. Subsequently, the photoresist is removed. A capacitor is formed in the lower portion of the deep trench. Next, a first insulation layer is formed on the capacitor, and an epitaxy layer is formed on the sidewalls of the deep trench above the first insulation layer as a liner to narrow the dimension of the deep trench. Finally, the first insulation layer uncovered by the epitaxy layer is removed.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 2A~2F illustrate cross sections of the method for forming bottle-shaped trenches according to the invention.

Figure 1A:
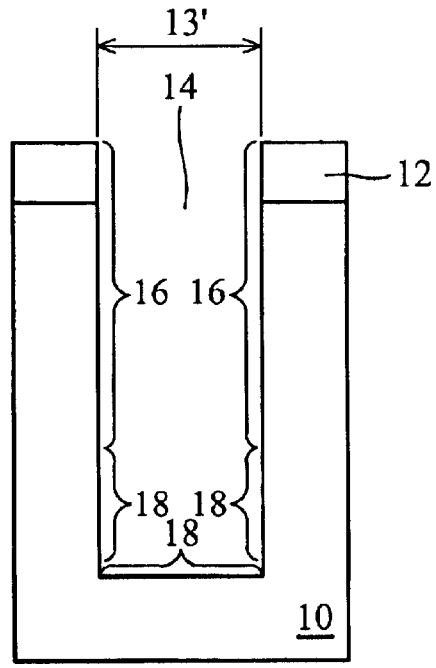
FIGS. 1A~1C are cross sections of forming bottle-shaped trenches by the conventional method.
Figure 1B:
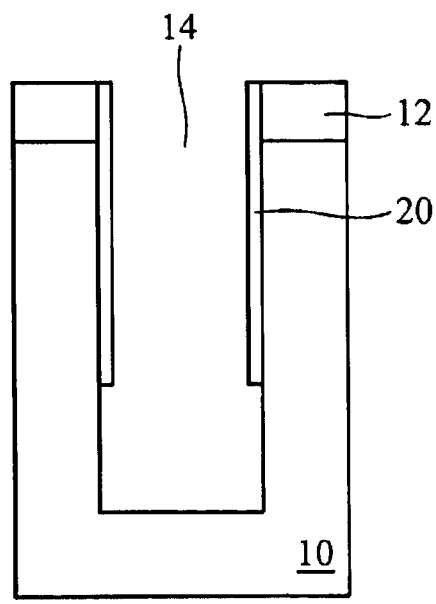
Figure 1C:
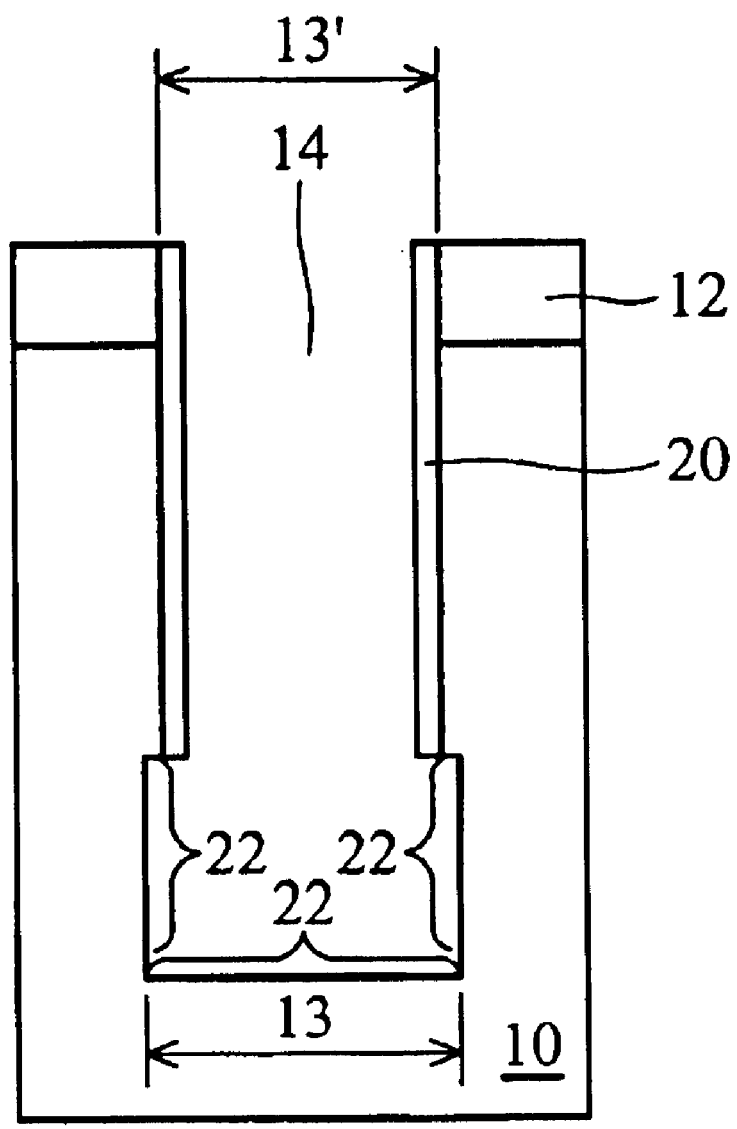
Figure 2A:
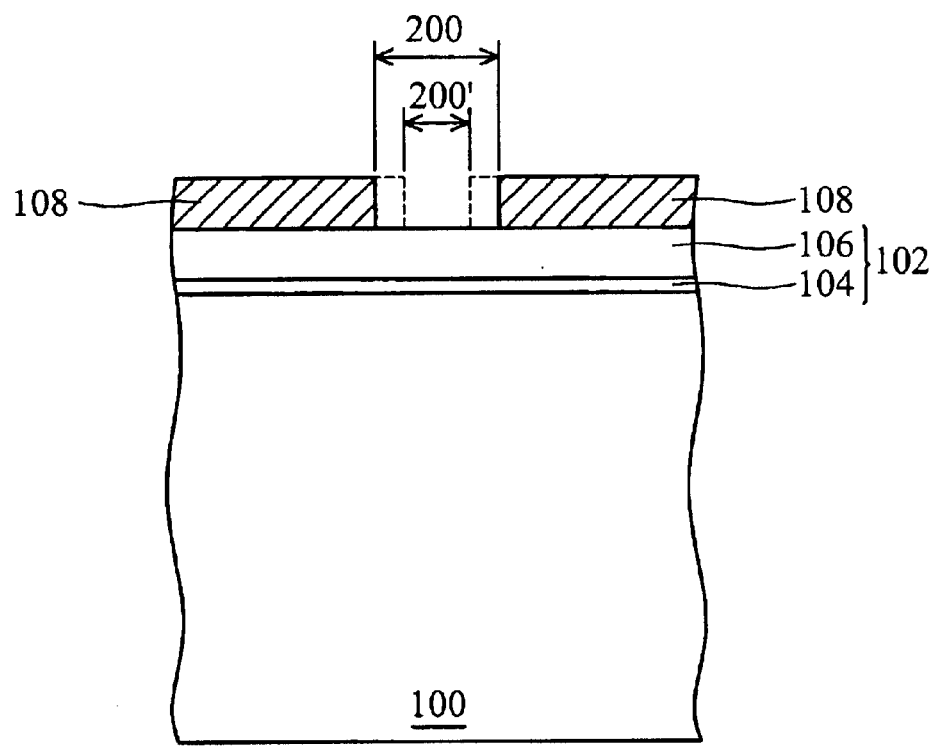
FIGS. 2A~2F are cross sections of the method for forming bottle-shaped trenches in an embodiment of the invention.

In FIG. 2A, which illustrates the initial step of the invention, 100 represents a semiconductor substrate, such as P-type, N-type, or epitaxy silicon. A pad layer 102 is formed on the substrate 100. The pad layer 102 comprises a pad oxide layer 104 and a pad nitride silicon layer 106. The pad oxide layer 104 is formed by thermal oxidation. The thickness of the pad oxide layer 104 is 100 Å. The pad nitride silicon layer 106 is formed on the pad oxide layer 104 by chemical vapor deposition (CVD). Subsequently, a patterned photoresist layer 108 is formed on the pad nitride silicon layer 106 by photolithography. The trench 110 is defined by the region uncovered by the patterned photoresist layer 108. The dimension 200 exceeds the predetermined dimension 200' of the trench to 100~200 Å.

Figure 2B:
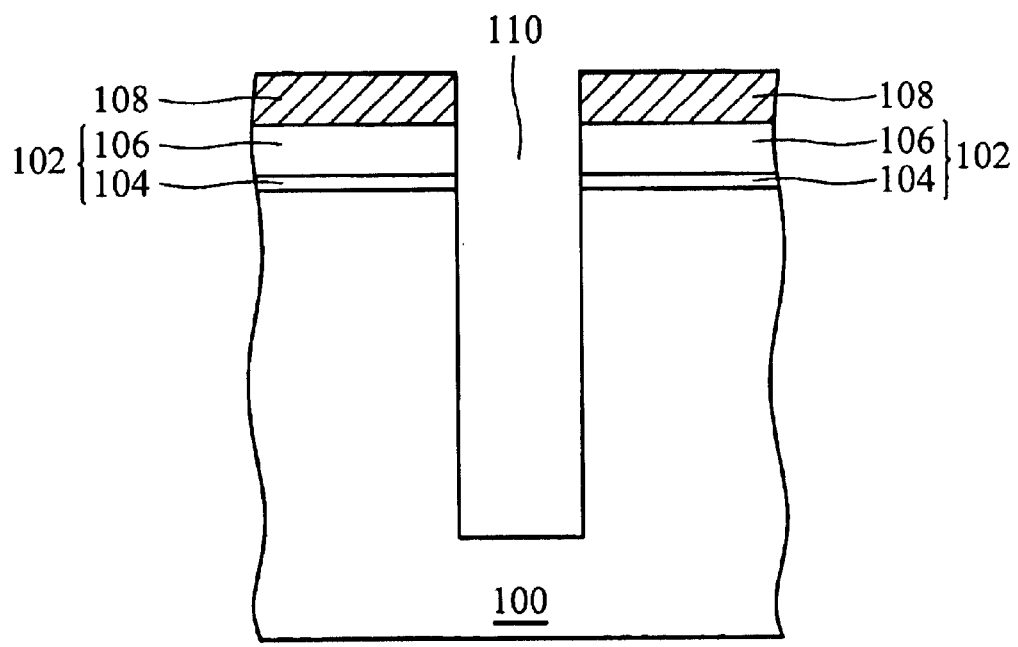

Then, referring to FIG. 2B, the patterned photoresist layer 108 is used as a hard mask, and the pad layer 102 uncovered by the patterned photoresist layer 108 is removed by etching. The patterned photoresist layer 108 and the pad layer 102 are used as an etching mask later, the substrate 100 uncovered by the pad layer 102 is etched, and the trench 110 is formed.

Figure 2C:
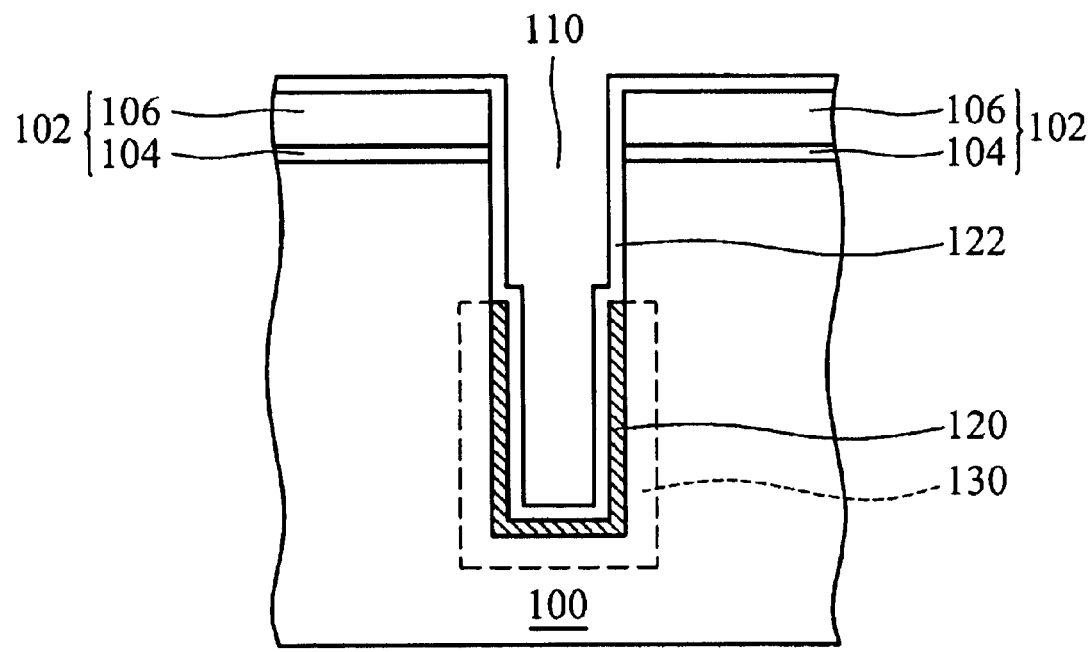

Subsequently, the trench capacitor 136 whose structure comprises a buried electrode plate 130, a conformational dielectric layer 132 of the capacitor, and a first conductive layer 134 used as an electrode plate, is formed in the lower portion of the trench 110. The method for forming the above trench capacitor 136 is performed by conventional process, as shown in FIG. 2C. The patterned photoresist layer 108 is removed at first, and a first dielectric layer 120 such as doped N-type layer, arsenic silicate glass (ASG), is formed on surface of the trench 110. Subsequently, a photoresist layer (not shown) is filled in the trench 110 to a specific height. The first doped dielectric layer 120 uncovered by the photoresist layer is removed by wet etching. The photoresist layer is removed fully. A first insulation layer 122 such as tetraethylorthosilane (TEOS) is deposited conformally to prevent doped ions penetrating into the substrate 100 uncovered by the doped first dielectric layer 120 of the sidewalls of the trench 110 in follow-up thermal processes. Then, doped ions of the first dielectric layer 120 penetrate into the substrate 100 in the thermal process. The buried electrode plates 130, doped N-type area, are formed.

Figure 2D:
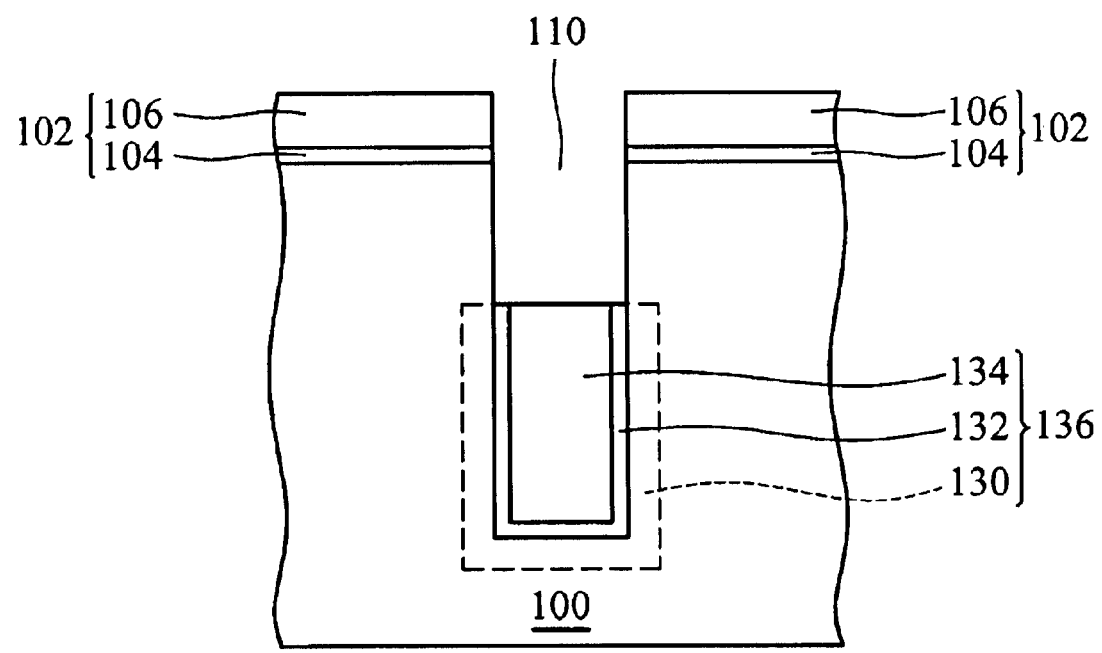

Subsequently, referring to FIG. 2D, the first insulation layer 122 and the doped first dielectric layer 120 are removed. A capacitor dielectric layer 132 is deposited conformally. Then, a first conductive layer 134 used as an electrode plate is fully filled in the trench 110. The structure of the capacitor dielectric layer 132 may include a stack structure comprising oxide-nitride (ON) or oxide-nitride-oxide (ONO). The first conductive layer 134 may include doped polycrystalline silicon or doped non-polycrystalline silicon. The first conductive layer 134 is flattened by chemical mechanical polishing (CMP). Then, the first conductive layer 134 and the capacitor dielectric layer 132 covering the upper portion of the trench 110 and the pad layer 102 are removed by etching to form the capacitor dielectric layer 132 and the electrode plate in the lower portion of the trench 110. Finally, the trench capacitor is formed.

Figure 2E:
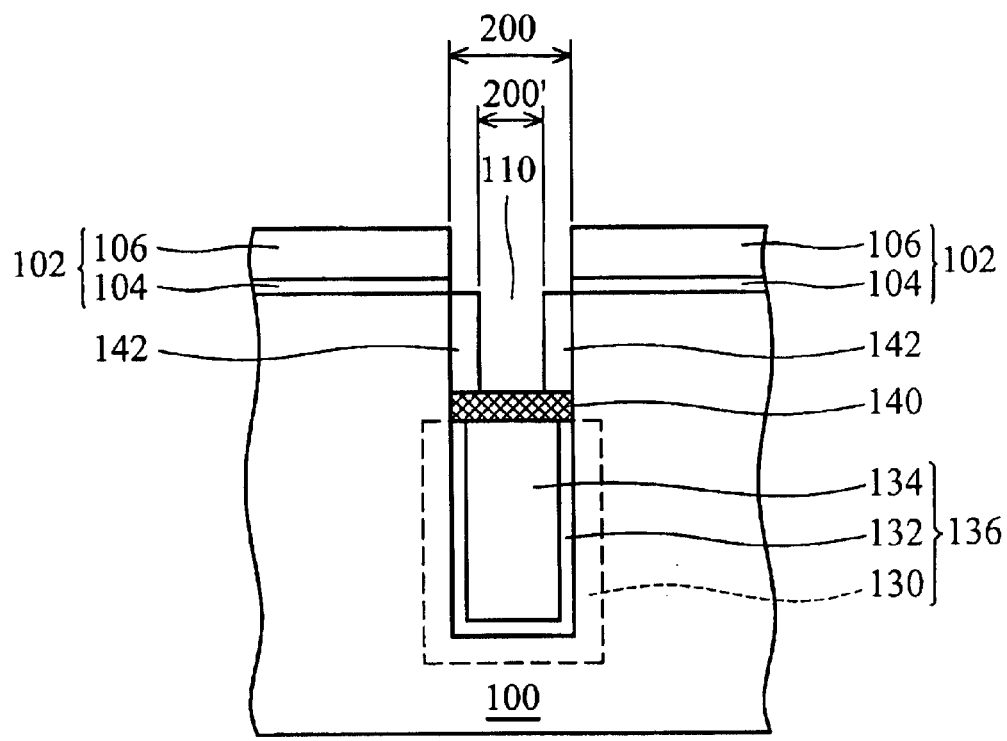

Subsequently, referring to FIG. 2E, a second insulation layer 140 such as high density plasma oxide silicon (HDP oxide) is deposited conformally. An etching such as wet etching is performed. The second insulation layer 140 is formed on the trench capacitor 136. Functions of the second insulation layer 140 include one used as an insulation layer between the trench capacitor 136 and the latter epitaxy layer 142, the other to prevent the epitaxy layer 142 from depositing on the capacitor 136 directly. The latter can raise the selectivity of etching, thus the epitaxy layer 142 reduces residue on the capacitor 136 in anisotropic etching. Next, the epitaxy layer 142 such as P-type or N-type epitaxy silicone is deposited on the pad layer 102, the second insulation layer 140, and the sidewalls of the trench 110. The thickness of the epitaxy layer 142 is 100~200 Å. The epitaxy layer 142 covering the pad layer 102 and the second insulation layer 140 is removed by isotropic etching. Finally, the epitaxy 142 is formed on the sidewalls of the trench 110. The dimension 200 of the trench 110 is reduced to 200' by the epitaxy layer 142 forming in the upper portion of the sidewalls of the trench 110. The reduced dimension 200' is the predetermined width of the trench.

Figure 2F:
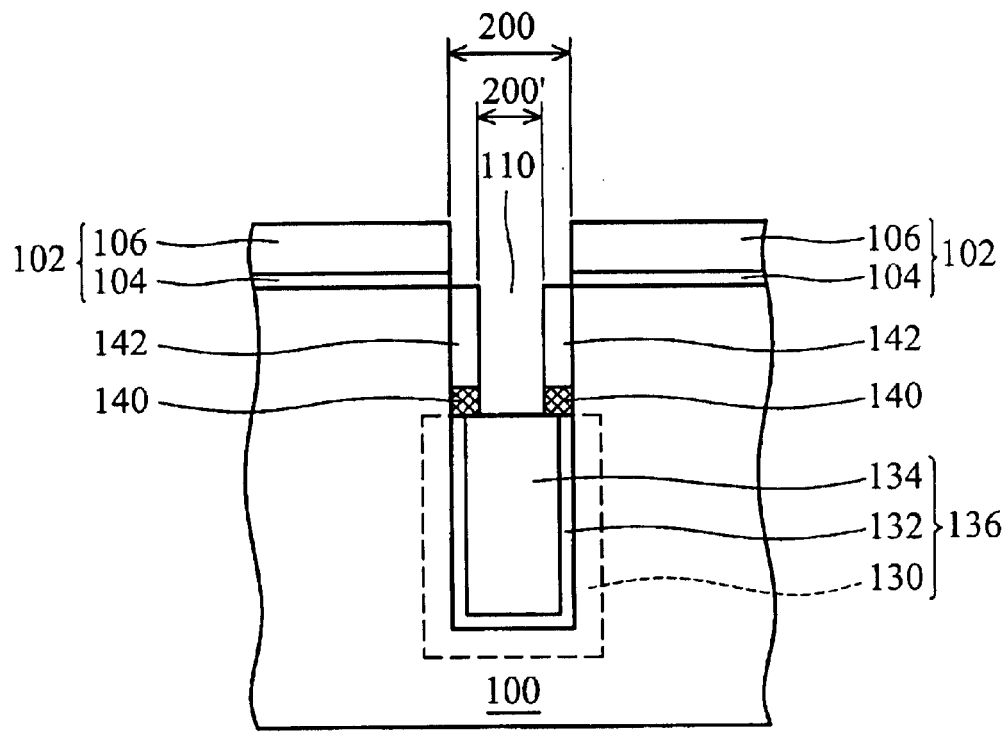

Finally, referring to FIG. 2F, the second insulation layer 140 uncovered by the epitaxy layer 142 is removed by etching, such as wet etching.

The conventional method for increasing the capacitance of the trench capacitor defines the dimension 13' first, then increases the dimension 13' to 13 in the lower portion 18 of the trench 14 by wet etching to enlarge surface area of the capacitor. Nevertheless, the present invention forms the larger dimension 200 of the trench 110 of the trench capacitor 136 first to increase surface area of the buried electrode plate 130 and the electrode plate 134. Then, the epitaxy layer 142 is formed on the sidewalls in the upper portion of the trench 110 of the capacitor 136. Finally, the reduced dimension 200' of the predetermined width is formed. According to the method provided in the invention, the trench 110 is a bottle shaped trench. The structure of the epitaxy layer 142 is the same as the substrate 100. Thus, the electrical characteristics of the memory device are maintained. Consequently, the present invention controls the shape of the lower portion of the trench, furthermore, increasing stability of the fabricating process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for increasing the capacitance of deep trench capacitors, comprising:
   providing a substrate;
   forming a pad structure on the substrate;
   forming a patterned photoresist layer on the pad structure, wherein a trench region is defined by the region uncovered by the patterned photoresist layer;
   forming a trench in the substrate using the patterned photoresist layer and the pad structure as an etching mask;
   removing the patterned photoresist layer;
   forming a trench capacitor in the lower portion of the trench;
   forming a first insulation layer on the trench capacitor;
   forming an epitaxy layer on the sidewalls of the trench above the first insulation layer as a liner to narrow the dimension of the trench; and
   removing the first insulation layer uncovered by the epitaxy layer.

2. The method as claimed in claim 1, wherein the substrate is made of P-type silicon, N-type silicon, or non-doped epitaxy silicon.

3. The method as claimed in claim 1, wherein the first insulation layer is made of high density plasma oxide silicon.

4. The method as claimed in claim 1, wherein the epitaxy layer is made of P-type epitaxy silicon, N-type epitaxy silicon, or non-doped epitaxy silicon.

5. The method as claimed in claim 1, wherein the thickness of the epitaxy layer is 100~200 Å.

6. The method as claimed in claim 1, wherein the insulation layer uncovered by the epitaxy layer is removed by wet etching.

7. A method for increasing the capacitance of deep trench capacitors, comprising:
   providing a substrate;
   forming a pad structure on the substrate, wherein the pad structure comprises a pad oxide layer and a pad nitride silicon layer;
   forming a patterned photoresist layer on the pad structure, wherein a trench region is defined by the region uncovered by the patterned photoresist layer, and the dimension of the region exceeds a predetermined dimension of the trench region;
   etching the pad structure uncovered by the patterned photoresist layer using the patterned photoresist layer as a mask;

etching the substrate uncovered by the pad structure using the patterned photoresist layer and the pad structure as a mask, thereby forming a trench in the substrate;

removing the patterned photoresist layer;

forming a trench capacitor in the lower portion of the trench, wherein the trench capacitor comprises a buried electrode plate, a capacitor dielectric layer, and a first conductive layer, as another electrode plate of the trench capacitor;

forming a first insulation layer on the trench capacitor, the sidewalls of the trench, and the pad structure;

removing the first insulation layer covering the sidewalls of the trench and the pad structure by etching, thus forming the first insulation layer on the trench capacitor;

forming an epitaxy layer on the pad structure, the first insulation layer, and the sidewalls of the trench;

removing the epitaxy layer on the pad structure and the first insulation layer by etching, thus forming an epitaxy layer on the sidewalls of the trench as a liner to narrow the dimension of the trench; and removing the first insulation layer uncovered by the epitaxy layer.

8. The method as claimed in claim 7, wherein the substrate is made of P-type silicon, N-type silicon, or non-doped epitaxy silicon.

9. The method as claimed in claim 7, wherein the pad oxide layer of the pad structure is formed by thermal oxidation.

10. The method as claimed in claim 7, wherein the pad nitride silicon layer of the pad structure is formed by chemical vapor deposition (CVD).

11. The method as claimed in claim 7, wherein the buried electrode plate of the trench capacitor is an N-type doped area.

12. The method as claimed in claim 7, wherein the capacitor dielectric layer of the trench capacitor is made of a stack layer comprising oxide-nitride (ON) or oxide-nitride-oxide (ONO) silicon.

13. The method as claimed in claim 7, wherein the first conductive layer of the trench capacitor is made of doped polycrystalline silicon or doped non-polycrystalline silicon.

14. The method as claimed in claim 7, wherein the first insulation layer is made of high density plasma oxide silicon.

15. The method as claimed in claim 7, wherein the epitaxy layer is made of P-type epitaxy silicon, N-type epitaxy silicon, or non-doped epitaxy silicon.

16. The method as claimed in claim 7, wherein the thickness of the epitaxy layer is 100~200 Å.

17. The method as claimed in claim 7, wherein the insulation layer uncovered by the epitaxy layer is removed by wet etching.

* * * * *